(12) United States Patent
Agarwal et al.

(10) Patent No.: US 7,967,936 B2
(45) Date of Patent: Jun. 28, 2011

(54) METHODS OF TRANSFERRING A LAMINA TO A RECEIVER ELEMENT

(75) Inventors: Aditya Agarwal, Sunnyvale, CA (US); Srinivasan Sivaram, Monte Sereno, CA (US); Michael Vyvoda, San Jose, CA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 287 days.

(21) Appl. No.: 12/335,479

(22) Filed: Dec. 15, 2008

(65) Prior Publication Data

US 2010/0147448 A1 Jun. 17, 2010

(51) Int. Cl.
*B29C 65/16* (2006.01)
*B32B 37/02* (2006.01)
*B32B 37/06* (2006.01)
*B32B 37/14* (2006.01)
*B32B 38/10* (2006.01)
*H01L 21/302* (2006.01)
*B29C 65/56* (2006.01)
*B32B 37/10* (2006.01)
*B32B 37/15* (2006.01)
*H01L 21/304* (2006.01)

(52) U.S. Cl. ............... 156/272.8; 156/272.2; 438/455; 438/57

(58) Field of Classification Search ............... 156/239, 156/272.2, 272.8; 438/54, 57, 455
See application file for complete search history.

(56) References Cited

U.S. PATENT DOCUMENTS

| | | | | |
|---|---|---|---|---|
| 6,100,165 | A * | 8/2000 | Sakaguchi et al. | 438/455 |
| 6,146,979 | A | 11/2000 | Henley et al. | |
| 6,339,010 | B2 * | 1/2002 | Sameshima | 438/458 |
| 6,362,077 | B1 * | 3/2002 | Aspar et al. | 438/458 |
| 6,613,678 | B1 * | 9/2003 | Sakaguchi et al. | 438/695 |
| 7,157,352 | B2 * | 1/2007 | Yamanaka | 438/458 |
| 7,166,520 | B1 * | 1/2007 | Henley | 438/458 |
| 7,238,598 | B2 | 7/2007 | Lagahe et al. | |
| 7,635,617 | B2 * | 12/2009 | Yamazaki | 438/149 |
| 7,754,519 | B1 * | 7/2010 | Tolles et al. | 438/57 |
| 2001/0016399 | A1 * | 8/2001 | Linn et al. | 438/455 |
| 2002/0106870 | A1 | 8/2002 | Henley et al. | |
| 2002/0153563 | A1 * | 10/2002 | Ogura | 257/347 |
| 2007/0235074 | A1 * | 10/2007 | Henley et al. | 136/252 |
| 2007/0277874 | A1 | 12/2007 | Dawson-Elli et al. | |

(Continued)

FOREIGN PATENT DOCUMENTS

WO 2007142865 A2 12/2007

OTHER PUBLICATIONS

International Search Report for PCT/IB2005/000347—May 3, 2005.*

(Continued)

*Primary Examiner* — Sonya Mazumdar
(74) *Attorney, Agent, or Firm* — The Mueller Law Office, P.C.

(57) ABSTRACT

Methods for bonding a donor wafer to a receiver element and transferring a lamina from the donor wafer to the receiver element are disclosed herein. The donor wafer may be, for example, a monocrystalline silicon wafer with a thickness of from about 300 microns to about 1000 microns, and the lamina may be may be less than 100 microns thick. The receiver element may be composed of, for example, metal or glass, and the receiver element may have dissimilar thermal expansion properties from the lamina. Although the lamina and the receiver element may have dissimilar thermal expansion properties, the methods disclosed herein maintain the integrity of the bond between the lamina and the receiver element.

24 Claims, 4 Drawing Sheets

U.S. PATENT DOCUMENTS

2008/0070340 A1 3/2008 Borrelli et al.
2008/0160661 A1 7/2008 Henley

OTHER PUBLICATIONS

U.S. Appl. No. 12/026,530, filed Feb. 5, 2008, entitled "Method to Form a Photovoltaic Cell Comprising a Thin Lamina".

U.S. Appl. No. 12/057,265, filed Mar. 27, 2008, entitled "Method to Form a Photovoltaic Cell Comprising a Thin Lamina Bonded to a Discrete Receiver Element".

U.S. Appl. No. 12/189,158, filed Aug. 10, 2008, entitled "Photovoltaic Cell Comprising a Thin Lamina Having a Rear Junction and Method of Making".

* cited by examiner

METHODS OF TRANSFERRING A LAMINA TO A RECEIVER ELEMENT

BACKGROUND OF THE INVENTION

In the manufacture of photovoltaic cells, among other things, it may be desirable to transfer a lamina that, in some aspects, may be less than 100 microns thick to a receiver element. As an example, the process of transferring the lamina to the receiver element may include exfoliating the lamina from a donor wafer such as a monocrystalline silicon wafer with a thickness of from about 300 microns to about 1000 microns and bonding the lamina to the receiver element, which may be composed of metal, glass, semiconductor material, polymer, or other suitable material. The usual transfer process includes implanting hydrogen ions within the donor wafer to form a cleave plane within the donor wafer, followed by bonding the donor wafer to the receiver element at ambient temperature, and then subsequently heating the donor wafer and the receiver element to a higher temperature to induce exfoliation of the lamina from the donor wafer along the cleave plane.

However, a bond between materials with dissimilar thermal expansion such as the bond between the donor wafer and receiver element may fail during the bonding and the lamina transfer process. Accordingly, there is a need for improved methods for transferring a lamina to a receiver element where the donor wafer and the receiver element have dissimilar thermal expansion properties.

BRIEF SUMMARY OF THE INVENTION

These and other needs and disadvantages are overcome by the methods disclosed herein. Additional improvements and advantages may be recognized by those of ordinary skill in the art upon study of the present disclosure. In various aspects, the methods for securing a lamina to a receiver element include several steps. A cleave plane is formed within a donor wafer, and the donor wafer is heated to an exfoliation temperature. The receiver element is also heated generally to the exfoliation temperature. The donor wafer is then bonded to the receiver element with the donor wafer generally at the exfoliation temperature and the receiver element generally at the exfoliation temperature. Finally, the donor wafer is exfoliated along the cleave plane thereby transferring a lamina onto the receiver element.

The Figures are to facilitate explanation of the present invention. The number, position, relationship and dimensions of the parts shown in the Figures to form the various implementations described herein, as well as dimensions and dimensional proportions to conform to specific force, weight, strength, flow and similar requirements, are explained herein or are understandable to a person of ordinary skill in the art upon study of this disclosure. Where used in various Figures, the same numerals designate the same or similar parts. Furthermore, when the terms "top," "bottom," "right," "left," "forward," "rear," "first," "second," "inside," "outside," and similar terms are used, the terms should be understood in reference to the orientation of the structures shown in the drawings and utilized to facilitate understanding.

DETAILED DESCRIPTION OF THE EMBODIMENTS OF THE INVENTION

Methods for transferring a lamina from a donor wafer to a receiver element are disclosed herein. The methods may allow for the transferring of a thin semiconductor lamina to the receiver element when the receiver element has a different coefficient of thermal expansion than the donor wafer. In various aspects, the methods include the steps of forming a cleave plane within the donor wafer, heating the donor wafer generally to an exfoliation temperature, heating the receiver element generally to the exfoliation temperature, bonding the donor wafer to the receiver element with the donor wafer generally at the exfoliation temperature and the receiver element generally at the exfoliation temperature, and exfoliating the donor wafer along the cleave plane thereby transferring a lamina onto the receiver element. The resulting assembly, which includes the lamina bonded to the receiver element, may then be cooled to ambient temperature. The methods, in various aspects, employ a sequence of steps that avoid a large change in temperature during the donor wafer bonding/exfoliation process that may lead to bond failure. The resulting assembly could be utilized in a photovoltaic cell in ways generally described in Sivaram et al., U.S. patent application Ser. No. 12/026,530, "Method to Form a Photovoltaic Cell Comprising a Thin Lamina," filed Feb. 5, 2008, and in Herner, U.S. patent application Ser. No. 12/057,265, "Method to Form a Photovoltaic Cell Comprising a Thin Lamina Bonded to a Discrete Receiver Element," filed Mar. 27, 2008, owned by the assignee of the present application and hereby incorporated by reference herein in its entirety for any and all purposes.

The donor wafer material of which the donor wafer is composed may be silicon, silicon based semiconductor material, or other type of semiconductor material such as the III-V, III-IV classes of semiconductors. Examples may include silicon, germanium-doped silicon (SiGe), silicon carbide (SiC), germanium (Ge), gallium arsenide (GaAs), gallium phosphide (GaP), and indium phosphide (InP).

The donor wafer material may be monocrystalline, polycrystalline, or multicrystalline in structure, and may include intentionally or accidentally induced defects and/or dopants. A monocrystalline wafer is composed substantially of a single crystal, although the crystal may include internal and/or surface defects either inherent or purposely formed such as lattice defects. Certain dopants included therein may affect the structure of the crystal. The term multicrystalline typically refers to material having crystals that are on the order of a millimeter in size. Polycrystalline material has smaller grains, on the order of a thousand angstroms. Monocrystalline, multicrystalline, and polycrystalline material is typically entirely or almost entirely crystalline, with no or almost no amorphous matrix. For example, non-deposited semiconductor material is at least 80 percent crystalline.

An exemplary donor wafer may be a monocrystalline silicon wafer of any practical thickness, for example from about 300 to about 1000 microns thick. In alternative embodiments, the wafer may be thicker; maximum thickness is limited only by practicalities of wafer handling. Alternatively, polycrystalline or multicrystalline silicon may be used, as may microcrystalline silicon, or wafers or ingots of other semiconductor material.

Dopant concentration, if any, in the exemplary monocrystalline silicon wafer may be between about $1 \times 10^{14}$ and $3 \times 10^{18}$ atoms/cm$^3$; for example between about $2 \times 10^{15}$ and $7 \times 10^{15}$ atoms/cm$^3$; for example about $5 \times 10^{15}$ atoms/cm$^3$. Desirable resistivity for n-type silicon may be, for example, between about 44 ohm-cm and about 0.005 ohm-cm, preferably about 2.5 ohm-cm to about 0.7 ohm-cm, for example about 1.0 ohm-cm. For p-type silicon, desirable resistivity may be between about 133 ohm-cm and about 0.01 ohm-cm, preferably between about 7 ohm-cm and about 2 ohm-cm, for example about 2.8 ohm-cm.

The receiver element may be composed of glass including oxide glass, glass-ceramic, oxide glass-ceramic. The glass may be silica based or non-silica based, and the glass may contain various ions or other additives. In various aspects, the receiver element may be composed of metal such as steel or aluminum, metal oxide, polymer, or combinations thereof. The receiver element, in some aspects, may be composed of donor wafer material. A plurality of materials may be used to form the receiver element, and the resultant receiver element may have a layered structure. In some implementations involving photovoltaic applications, the receiver element may be transparent, for example, in the infrared, visible, and/or ultraviolet wavelengths. In one exemplary aspect, the receiver wafer is float glass and is between about 200 microns and about 3000 microns thick.

The donor wafer may be about 200 microns to about 1000 microns in thickness, and the donor wafer may be any shape including, for example, circular, square, or octagonal. The donor wafer may be any size, though standard wafer sizes may be preferred, as standard equipment exists for handling them. Standard wafer sizes are 100 mm, 125 mm, 150 mm, 200 mm, and 300 mm. In many embodiments, receiving surface of receiver wafer is slightly larger than first surface of donor wafer, for example overlapping it on all sides by some millimeters. In most preferred embodiments, however, the widest dimension of the receiver wafer will not exceed the widest dimension of the donor wafer by more than 50 percent. In other embodiments, the widest dimension of receiver wafer will not exceed the widest dimension of donor wafer by more than about 10 percent or about 20 percent. In some embodiments, the receiver wafer may have a different shape than the donor wafer. For example, the receiver wafer may be square, while the donor wafer is an octagon that fits within the area of the square.

The Figures referenced herein generally illustrate various exemplary implementations of the methods for transferring a lamina from a donor wafer to a receiver element. These illustrated implementations are not meant to limit the scope of coverage, but, instead, to assist in understanding the context of the language used in this specification and in the claims. Accordingly, variations of the methods for transferring a lamina from a donor wafer to a receiver element that differ from these illustrated implementations may be encompassed by the appended claims that alone define the invention.

Figure 1A:
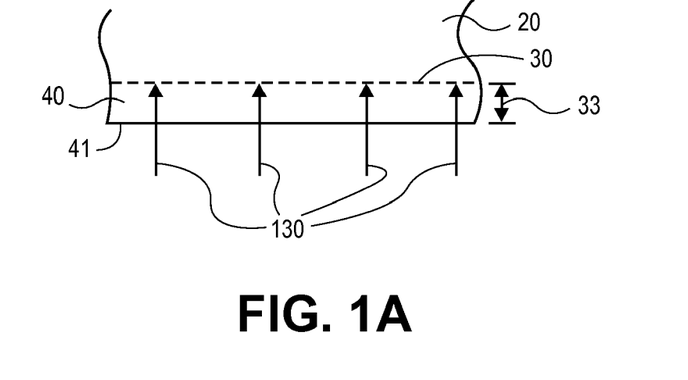
FIG. 1A illustrates by a cross-sectional view an exemplary method for securing a lamina to a receiver element at a first level of implementation.
Figure 1B:
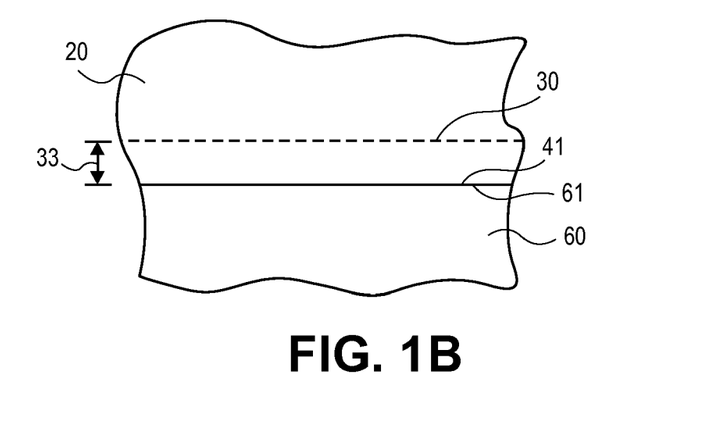
FIG. 1B illustrates by a cross-sectional view the exemplary method for securing a lamina to a receiver element of FIG. 1A at a second level of implementation.
Figure 1C:
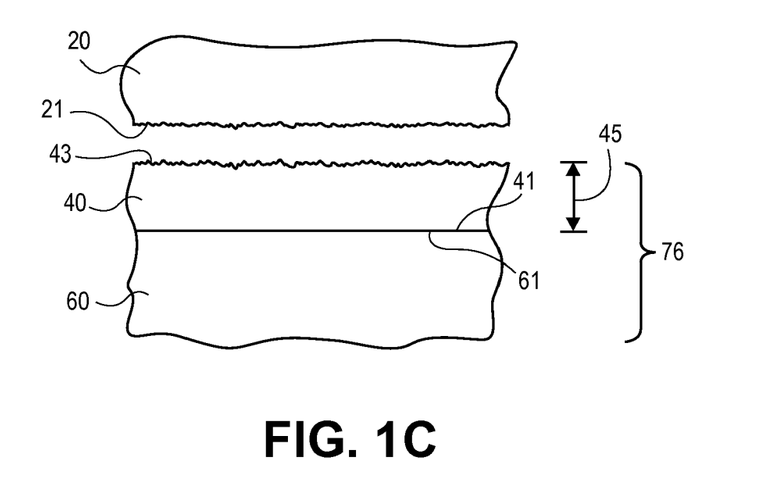
FIG. 1C illustrates by a cross-sectional view an exemplary method for securing a lamina to a receiver element of FIG. 1A at a third level of implementation.

An exemplary implementation of the methods for transferring a lamina from the donor wafer to the receiver element is illustrated in FIGS. 1A, 1B, and 1C. As illustrated in FIG. 1A, one or more species of gas ions 130 are implanted through a surface 41 of a donor wafer 20 thereby forming a cleave plane 30 within the donor wafer 20. Gas ions 130 may be, for example, hydrogen and/or helium. As the gas ions 130 pass through the donor wafer material of the donor wafer 20, the gas ions 130 are slowed by electronic interactions and collisions with atoms in the lattice of the donor wafer material. The gas ions 130 reach a distribution of implant depths within this lattice, some deeper, some shallower, and this distribution of implant depths will have a maximum concentration at some depth below surface 41. The gas ions 130 produce damage in the lattice of the donor wafer material at a distribution of depths, where the damage may be in the form of vacant lattice sites created by displacement of the lattice atoms due to collisions with the incoming implanted atoms or in the form of micro-cracks and/or bubbles, depending upon the nature of the gas ions 130. This damage has a depth of maximum concentration, which is slightly shallower than the implant depth of the maximum concentration of implanted gas ions 130, and defines a cleave plane 30 along which a lamina 40, which is the portion of the donor wafer 20 between surface 41 and cleave plane 30, can be cleaved from the donor wafer 20. The cleave plane depth 33 of cleave plane 30, as illustrated in FIG. 1A, is the distance of the cleave plane 30 from surface 41 through which the gas ions 130 are implanted. The cleave plane depth 33 may range from between about 0.2 microns and about 100 microns in various aspects. Additional details of the gas ion 130 generation and implantation of gas ions 130 to form cleave plane 30 may be found in Sivaram et al., U.S. patent application Ser. No. 12/026,530 cited above.

Following the formation of the cleave plane 30, the donor wafer 20 may be heated to about an exfoliation temperature and the receiver element 60 may be heated to about the exfoliation temperature. The donor wafer 20 and the receiver element 60 may be generally separate from one another while the donor wafer 20 and the receiver element 60 are heated to the exfoliation temperature. As an example, the exfoliation temperature may be about 380° C. When both the donor wafer 20 and the receiver element 60 are at about the exfoliation temperature, the surface 41 of donor wafer 20 may be generally biased against a surface 61 of the receiver element 60, and, for example, subjected to about 500V to form an anodic bond between the donor wafer 20 and the receiver element 20, as generally illustrated in FIG. 1B. Alternatively, the bond may be formed by thermo-compression of the donor wafer 20 and receiver element 60. The donor wafer 20 then becomes bonded to the receiver element 60 under the influence of the bias, while both the donor wafer 20 and the receiver element 60 are at the exfoliation temperature. After bonding the donor wafer 20 to the receiver element 60, the receiver element 60 and the donor wafer 20 bonded thereto are maintained at the exfoliation temperature. When the donor wafer 20 is at the exfoliation temperature, the implanted gas ions 130 migrate to cleave plane 30, forming bubbles or micro-cracks. The bubbles or micro-cracks expand and merge, resulting in separation of lamina 40 from donor wafer 20. Accordingly, the receiver element 60 and the donor wafer 20 bonded thereto are maintained at the exfoliation temperature until the lamina 40 separates from the donor wafer 20 thereby leaving the lamina 40 bonded to the receiver element 60 and forming surface 43 on lamina 40 and surface 21 on donor wafer 20, as illustrated in FIG. 1C. Following exfoliation, the resulting assembly 76 may be cooled to the ambient temperature and/or otherwise further processed.

Alternatively, following the formation of the cleave plane 30 within the donor wafer 20 by the implantation of gas ions 130, the donor wafer 20 and the receiver element 60 may be heated to about a bonding temperature, the bonding temperature being less than the exfoliation temperature but greater than the ambient temperature, for example, the bonding temperature may be about 350° C. With both the donor wafer 20 and the receiver element 60 at about the bonding temperature, the donor wafer 20 may be generally biased against the receiver element 60, resulting in the donor wafer 20 being bonded to the receiver element 60 while both the receiver element 60 and the donor wafer are at the bonding temperature. The bond may be formed by thermo-compression or an anodic bond formed by applying a voltage generally across the donor wafer 20 and the receiver element 60. After bonding the donor wafer 20 to the receiver element 60, the receiver element 60 and the donor wafer 20 bonded thereto are heated from the bonding temperature to the exfoliation temperature, which may be, for example, about 400° C. The receiver element 60 and the donor wafer 20 bonded thereto are maintained at the exfoliation temperature until the lamina 40 separates from the donor wafer 20 at cleave plane 30 thereby leaving the lamina 40 bonded to the receiver element 60 to form assembly 76, as illustrated in FIG. 1C. The lamina thickness 45 of the lamina 40 may be generally equal to the cleave plane depth 33. The resulting assembly 76 may be cooled to ambient temperature and/or otherwise further processed.

Figure 2A:
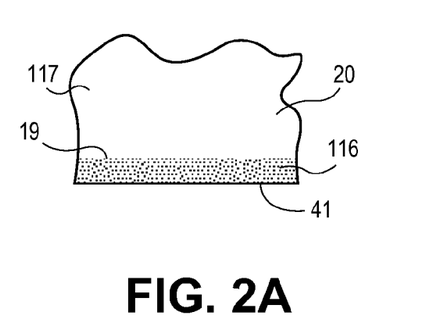
FIG. 2A illustrates by a cross-sectional view another exemplary method for securing a lamina to a receiver element at a first level of implementation.
Figure 2B:
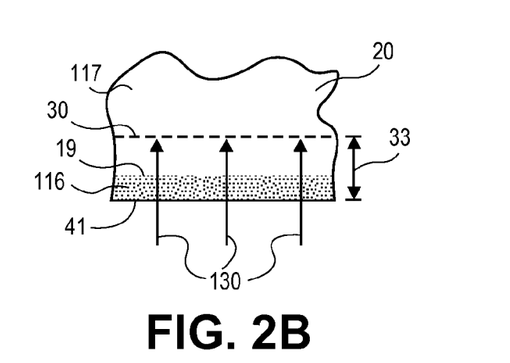
FIG. 2B illustrates by a cross-sectional view the exemplary method for securing a lamina to a receiver element of FIG. 2A at a second level of implementation.
Figure 2C:
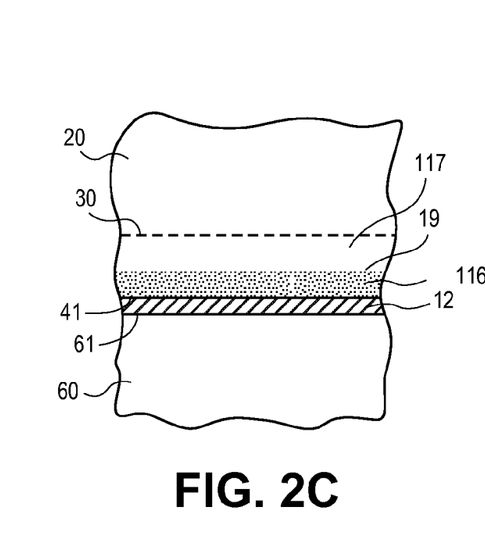
FIG. 2C illustrates by a cross-sectional view the exemplary method for securing a lamina to a receiver element of FIG. 2A at a third level of implementation.
Figure 2D:
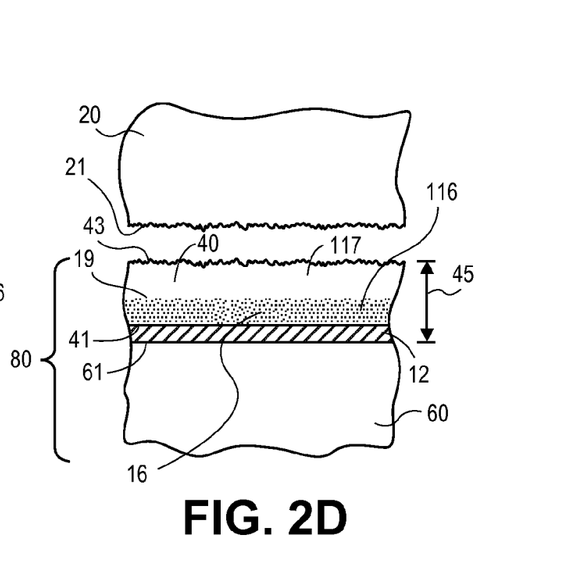
FIG. 2D illustrates by a cross-sectional view the exemplary method for securing a lamina to a receiver element of FIG. 2A at a fourth level of implementation.
Figure 5A:
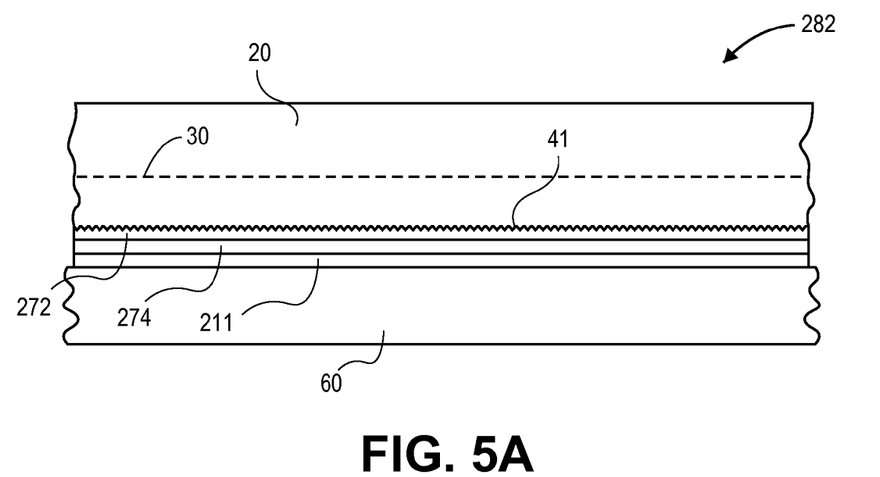
FIG. 5A illustrates by cross-sectional view the exemplary method of securing a lamina to a receiver element at a first level of implementation.
Figure 5B:
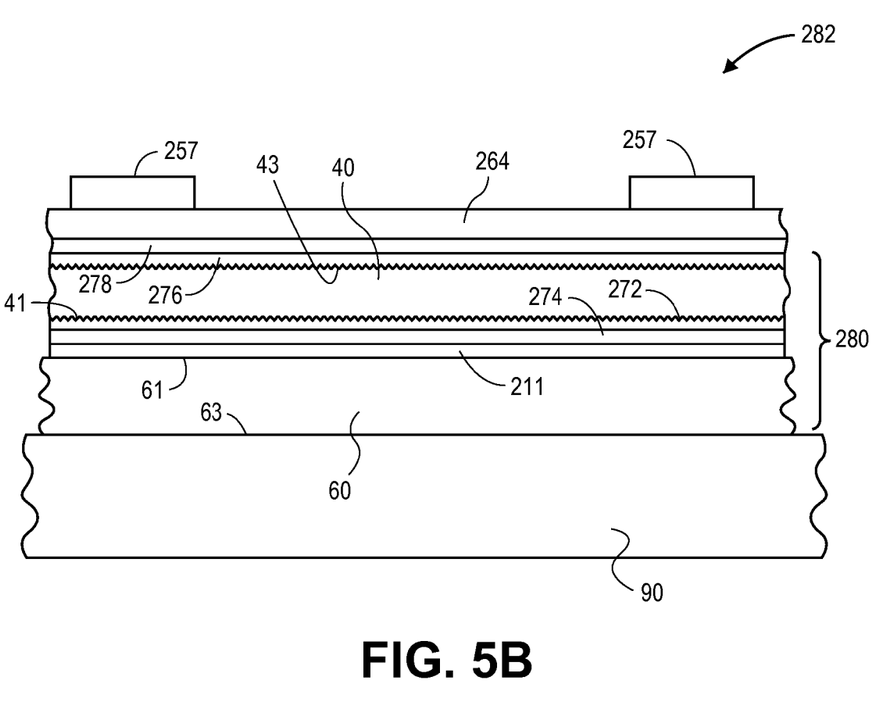
FIG. 5B illustrates by cross-sectional view the exemplary method of securing a lamina to a receiver element at a second level of implementation.

In some aspects, surface 41 of the donor wafer 20 may be directly bonded to surface 61 of receiver element 60, as generally illustrated in FIGS. 1B and 1C, while, in other aspects, one or more conductive layers, adhesive layers, non-conductive layers, or other intermediate layers or combinations of layers may be interposed between surface 41 of the donor wafer 20 and surface 61 of the receiver element 60, as generally illustrated in FIGS. 2C and 2D and also in FIGS. 5A and 5B. Surface 61 of receiver element 60 may have roughly the same dimensions as surface 41 of donor wafer 20, or surface 61 may be slightly larger, in various aspects. Donor wafer 20 and receiver element 60 may be generally bonded to one another either with or without one or more intermediate layers interposed between the donor wafer 20 and the receiver element 60 using known bonding techniques, such as, for example, plasma bonding, thermo-compression bonding, and anodic bonding.

Plasma bonding includes plasma-activation of bonding surfaces, which, for example, enables direct covalent bonding between the donor wafer 20 and the receiver element 60. For example, surface 41 of the donor wafer and surface 61 of the receiver element 60 are polished followed by activation of surface 41 and surface 61 by application of an $O_2$ or $N_2$ plasma treatment and subsequent wet-dip process in a standard clean one or de-ionized water bath. The wet dip process step increases the bond strength of the plasma enhanced bonding. The donor wafer 20 and the receiver element 60 are then biased against one another such that covalent bonds form between surface 41 and surface 61 that bond surface 41 and surface 61 together.

Thermo-compression may be used to bond the donor wafer 20 to the receiver element 60. In some implementations, a layer 12 (see FIGS. 2C and 2D, for example) may be interposed between surface 61 of the receiver element and surface 41 of the donor wafer 20. The layer 12 may be conductive or insulating, and combinations of layers 12 may be interposed between surface 61 and surface 41, in various implementations. The bond may be formed by thermo-compression of the layer 12, the application of sufficient heat and/or pressure to cause the layer 12 to fuse to surface 41 and to surface 61 so that the donor wafer 20 is bonded to receiver element 60 with the layer 12 generally interposed therebetween. Thermo-compression bonding may be performed at temperatures ranging from ambient to the exfoliation temperature and with a compressive pressure ranging from about 100 Pa to 1,000,000 Pa. In various implementations, the force may be more than about 10,000 Pa but less than about 100,000 Pa. In some implementations, layer 12 may be formed of an adhesive, a high temperature epoxy for example. The donor wafer 20 is then bonded adhesively to the receiver element 60 by adhesive layer 12 by application of heat and/or pressure. In various implementations, additional layers may be interposed with one or more adhesive layers between surface 41 of the donor wafer and surface 61 of the receiver element.

An anodic bond may be formed between surface 41 of the donor wafer 20 and surface 61 of the receiver element 60 by application of voltage. In order to form the anodic bond, for example, the donor wafer 20 and the receiver element are heated and then mechanical pressure is applied to bias surface 41 against surface 61. In various implementations, the mechanical pressure may be between about 100 Pa and about 10,000 Pa. Next, a voltage is applied across the donor wafer 20 and the receiver element 60, for example with the donor wafer 20 as the positive electrode and the receiver element 60 as the negative electrode. The application of the voltage, for example, may cause alkali or alkaline earth ions in the receiver element 60 formed of glass to migrate from the surface 61 further into the receiver element 60, which causes the surface 61 of receiver element 60 to become reactive and bond to surface 41 of the donor wafer 20. Layer 12 (FIGS. 2C and 2D) may be interposed between surface 61 of the receiver element and surface 41 of the donor wafer 20, in some aspects, and voltage applied across the donor wafer 20 and the receiver element 60. The voltage causes the layer 12 to fuse to surface 41 and to surface 61 and thereby bond surface 41 of the donor wafer 20 to surface 61 of the receiver element 60 with the layer 12 sandwiched between surface 41 and surface 61. The bonding temperature, in various implementations, may range from less than 250° C. to greater than 450° C. In certain implementations, the bonding temperature may be in the range from about 350° C. to about 400° C., which ensures the mobility of a sufficient number of ions to enable formation of the bond in certain implementations.

Following formation of the bond between the donor wafer 20 and the receiver element 60, the lamina 40 is exfoliated from the donor wafer 20. Accordingly, the lamina 40 is supported by the receiver element 60 from inception. The exfoliation temperature is the temperature at which exfoliation of the lamina 40 from the donor wafer 20 is induced and the exfoliation time is the time over which exfoliation occurs at a particular exfoliation temperature. The exfoliation temperature may be, for example, between about 200° C. and about 800° C., and exfoliation of the lamina 40 from the donor wafer 20 proceeds more quickly at higher temperature. In some implementations, the exfoliation temperature is between about 200° C. and about 500° C. with exfoliation time on the order of hours at 200° C., and exfoliation time on the order of seconds at 500° C. In some implementations, the exfoliation temperature is generally about 380° C. At the exfoliation temperature, defects at cleave plane 30 expand as more and more unbonded gas ions within the donor wafer material of the donor wafer 20 diffuse in all directions, some collecting at the cleave plane 30 and forming micro-cracks. Eventually the micro-cracks merge and the pressure exerted by the expanding gas causes lamina 40 to separate entirely from the donor wafer 20 along cleave plane 30. The presence of receiver element 60, which is generally bonded to the donor wafer 20, may stabilize the lamina 40 by forcing the micro-cracks to expand generally parallel to the surface 61 of the receiver element 60 thereby splitting the lamina 40 from the donor wafer 20 generally along cleave plane 30, rather than expanding perpendicularly to cleave plane 30, which would lead to blistering and flaking at surface 41. Boron doping of the donor wafer enhances the diffusion of hydrogen, thereby reducing the exfoliation temperature at which the exfoliation of the lamina 40 can be performed. Accordingly, boron may be included in the gas ions 130 in various aspects.

In various aspects, the exfoliation temperature is chosen such that the corresponding exfoliation time is sufficient to allow for bonding of the donor wafer 20 to the receiver element 60, for example, to stabilize the lamina 40 before exfoliation proceeds to a level that could damage the lamina 40. The exfoliation time, for example, should be sufficient to allow the donor wafer 20 and the receiver element 60 to be heated to about the exfoliation temperature, for the donor wafer 20 and the receiver element 60 to be biased about one another when the donor wafer 20 and the receiver element 60 are at about the exfoliation temperature, and for the bond to be formed between the donor wafer 20 and the receiver element 60 with the donor wafer 20 and the receiver element at about the exfoliation temperature before the exfoliation time elapses and the lamina 40 exfoliates from the donor wafer 20.

Figure 3:
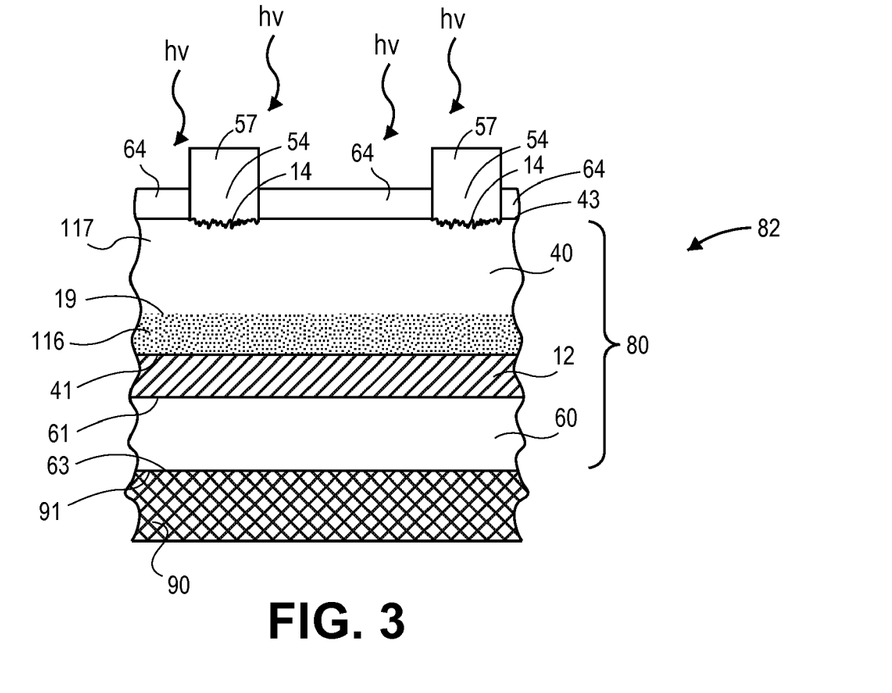
FIG. 3 illustrates by a cross-sectional view an exemplary implementation of a photovoltaic cell with a lamina secured to a receiver element included therein.

An exemplary implementation of the methods is illustrated in FIGS. 2A, 2B, 2C, and 2D that includes the formation of p-n junction 19 within the lamina 40 such as may be used, for example, within a photovoltaic assembly 82 (FIG. 3). With reference to FIG. 2A, donor wafer 20 is formed of monocrystalline silicon lightly to moderately doped with a first conductivity type to form a first region 117. In the present example, the first conductivity type is n-type, but it should be understood that, in this and other examples, the dopant types can be reversed, the amount of dopant(s) such that the material is strongly doped or weakly doped can be altered, or the doping of at least portions of the donor wafer 20 otherwise altered.

In this implementation, surface 41 of the donor wafer 20 may be treated to produce surface roughness, for example, to form surface 41 into a Lambertian surface. The lamina thickness 45 of the lamina 40 limits the achievable surface roughness. In various implementations, the lamina thickness 45 of the lamina 40 may be between about 0.2 microns and about 100 microns and preferentially between about 1 micron and about 80 microns. For various lamina thicknesses 45, a lower limit of surface roughness might be about 500 angstroms, and an upper limit might be about a quarter of the lamina thickness 45. For a lamina thickness 45 of 1 micron, the surface roughness may be between about 600 angstroms and about 2500 angstroms. For a lamina 40 having a lamina thickness 45 of about 10 microns, surface roughness will be less than about 25000 angstroms, for example between about 600 angstroms and 25000 angstroms. For a lamina 40 having a lamina thickness 45 of about 20 microns, the surface roughness may be between about 600 angstroms and 50000 angstroms.

Following treatment, if any, of surface 41 of the donor wafer 20, the surface 41 is doped, for example, by diffusion doping with a dopant of a second conductivity type opposite that of the first conductivity type, as illustrated in FIG. 2A, to form a second region 116 having conductivity type opposite that of the first region 117 with p-n junction 19 as the boundary between first region 117 and second region 116. In this example, the first conductivity type is n-type, so dopant ions of the second conductivity type, in this example p-type, are diffused through surface 41 to form a heavily doped p-type region 116. Doping may be performed with any conventional p-type donor gas such as, for example, $B_2H_6$ or $BCl_3$, and the resulting dopant concentration may be, for example, between about $1 \times 10^{18}$ atoms/cm$^3$ and $1 \times 10^{21}$ atoms/cm$^3$, for example about $1.5 \times 10^{20}$ atoms/cm$^3$.

After the doping through surface 41, gas ions 130 such as hydrogen or a combination of hydrogen and helium are implanted into the donor wafer 20 through surface 41 to define a cleave plane 30, as illustrated in FIG. 2B. Note that the plane of maximum distribution of implanted ions and the plane of implant damage are conformal meaning that any irregularities at surface 41 will be reproduced in cleave plane 30. Thus, in some implementations, if surface 41 is to be roughened, it may be preferential to roughen surface 10 following the implantation of gas ions 130 through surface 41 rather than prior to the implantation of the gas ions 130 through surface 41.

Layer 12 is formed on surface 41 of the donor wafer 20, on surface 61 of receiver element 60, or both, and, subsequently, surface 41 is generally biased against surface 61 with layer 12 interposed between surface 41 and surface 61, as illustrated in FIG. 2C. The layer 12 may be created by, for example, deposition, sputtering, or other appropriate method. Layer 12 is conductive in various implementations, and layer 12 may be reflective in various implementations. The layer 12 may bond the donor wafer 20 to the receiver element 60 and thus bond lamina 40 to the receiver element 60 and may form an electrically conductive contact with the lamina 40. Layer 12 may be formed from various metals or metal oxides, for example, silver, gold, platinum, titanium, aluminum, chromium, molybdenum, tantalum, zirconium, vanadium, indium, cobalt, antimony, and tungsten, and alloys thereof. Layer 12 may be formed of transparent metal oxides such as aluminum-doped zinc oxide, indium tin oxide, tin oxide, or titanium oxide. Layer 12 may be formed as a combination of metals and/or metal oxides. For example, in some implementations, layer 12 may be deposited on surface 41 and a layer 12 of a different metal or metal oxide may be deposited on surface 61. In other implementations, layer 12 may be formed of generally nonconductive materials such as amorphous silica and the nonconductive material may be doped. Note that, in this exemplary implementation, the doping of surface 41 occurs prior to the implantation of the gas ions 130 through surface 41, as the doping step may include high temperatures that may induce exfoliation. Accordingly, doping and other high temperature steps that may cause exfoliation are generally avoided following formation of the cleave plane 30 until exfoliation is desired.

Following the formation of the cleave plane 30 and subsequent creation of the layer 12 on surface 41, surface 61, or both, the donor wafer 20, the receiver element 60, and the layer 12 are heated generally to about the exfoliation temperature. The donor wafer 20 and the receiver element 60 may be generally maintained separate from one another while being heated to about the exfoliation temperature. With the donor wafer 20, the layer 12, and the receiver element 60 at about the exfoliation temperature, surface 41 is generally biased against surface 61 with layer 12 interposed between surface 41 and surface 61, and the donor wafer 20, layer 12, and receiver element 60 are bonded together as illustrated in FIG. 2C. The bond may be formed by thermo-compression or by anodic bonding, and the exfoliation temperature may facilitate the bonding of the donor wafer 20, layer 12, and receiver element 60 to one another. After bonding, the receiver element 60 layer 12 and the donor wafer 20 are maintained at about the exfoliation temperature until the lamina 40 separates from the donor wafer 20 along the cleave plane 30 thereby forming the assembly 80 that includes the layer 12 interposedly bonded to the lamina 40 and to the receiver element 60, as illustrated in FIG. 2D.

In other implementations, following the formation of the cleave plane 30 within the donor wafer 20 by the implantation of gas ions 130 and subsequent creation of the layer 12, the donor wafer 20, layer 12, and the receiver element 60 may be heated to a bonding temperature, the bonding temperature being less than the exfoliation temperature. The donor wafer 20 and the receiver element 60 may be generally maintained separate from one another while being heated to about the bonding temperature. With the donor wafer 20, the layer 12, and the receiver element 60 at the bonding temperature, surface 41 is generally biased against surface 61 with layer 12 interposed between surface 41 and surface 61, and the donor wafer 20, layer 12, and receiver element 60 are bonded together as illustrated in FIG. 2C. The bond may be formed by thermo-compression or by anodic bonding, and the bonding temperature may facilitate the bonding of the donor wafer 20, layer 12, and receiver element 60 to one another. In other implementations, an adhesive layer intervenes between the donor wafer 20 and the receiver element 60 so that the donor wafer, layer 12, and the receiver element 60 are adhesively bonded to one another, at least in part.

After bonding, the receiver element 60, layer 12, and the donor wafer 20 are heated from the bonding temperature to the exfoliation temperature and subsequently maintained at the exfoliation temperature until the lamina 40 separates from the donor wafer 20 along the cleave plane 30 thereby forming the assembly 80 that includes the layer 12 interposedly bonded to the lamina 40 and to the receiver element 60, as illustrated in FIG. 2D.

In still other implementations, portions of the assembly 80 may be heated to different temperatures in the bonding step. For example, the donor wafer 20 with layer 12 attached thereto may be heated to a first bonding temperature, and the receiver element 60 may be heated to a second bonding temperature where the first bonding temperature differs from the second bonding temperature by at least 1° C., and both the first bonding temperature and the second bonding temperature are less than the exfoliation temperature. With the donor wafer 20 and the layer 12 at the first bonding temperature, and the receiver element 60 at the second bonding temperature, surface 41 is generally biased against surface 61 with layer 12 interposed between surface 41 and surface 61, and the donor wafer 20, layer 12, and receiver element 60 are bonded together. The donor wafer 20, layer 12, and receiver element 60 may then be heated to the exfoliation temperature to exfoliate the lamina 40.

The formation of the cleave plane by implanting gas ions 130 may produce some damage to the crystalline structure of the lamina 40 at or near surface 43, which is formed by the separation of the lamina 40 from the donor wafer 20. This damage could cause excessive recombination of photogenerated carriers, as well as high resistivity to electrical contact with the surface 43. While this damage could be repaired by high-temperature annealing, it is preferred to avoid high-temperature processing at this point in order to avoid disrupting the bond between the lamina 40 and the receiver element 60. As an alternative to high temperature annealing, the damaged layer could be etched off, for example, in a solution of $HF:H_2C_3O_2:HNO_3$ in a ratio of 2:5:15 for about 3-5 sec. Such an etching step would remove about 0.25 microns of silicon, which may contain all of the damaged material. As another alternative to high temperature annealing, an alkaline etch using, for example, KOH could be employed to remove the damaged material.

The lamina 40 may be bonded to receiver element 60 to form, for example, assembly 76 or assembly 80, which may be fabricated into a photovoltaic assembly 82 such as, for example, that generally illustrated in FIG. 3, which is generally referred to in the following discussion. In various implementations, the lamina 40 may form at least a portion of a base and/or emitter of a photovoltaic cell, while in others lamina 40 forms the entire base and emitter of the photovoltaic cell. The photovoltaic assembly 82, as illustrated in FIG. 3, is formed from the assembly 80 in such a way that the assembly 80 is not subjected to high temperatures that could disrupt the bond between the lamina 40 and the receiver element 60. Photovoltaic assembly 82 converts photons into electrical energy. Incident photons increase the energy of electrons from the conduction band to the valence band thereby creating charge carriers in the form of electrons and holes on opposite sides of the p-n junction 19. Layer 12 is formed from a conductive material such as a metal in this implementation, and layer 12 and the conductive contacts 57 located on opposite sides of the p-n junction 19 collect the resulting current.

In various implementations, the donor wafer 20 and, hence, the lamina 40 may be lightly doped with a dopant of a first conductivity type. The donor wafer 20 may then be doped through surface 41 prior to bonding to the receiver element 60 to form a more heavily doped second region 116 having conductivity opposite that of the first region 117 with p-n junction 19 as the boundary between first region 117 and second region 116. In some implementations, the first region 117 may be n-type and the second region 116 may be p-type, while, in other implementations, the first region 117 may be p-type and the second region 116 n-type. The more lightly doped first region 117 is the base and the more heavily doped second region 116 is the emitter in this illustrated implementation. Most carriers are generated within the base, and the base may be the thickest layer of the photovoltaic cell.

In forming assembly 80, the second region 116 and p-n junction 19 are formed generally proximate surface 41 of the lamina 40 by diffusion through surface 41. Surface 41 is bonded to layer 12 and thence to surface 61 of receiver element 60. Photons pass through surface 43, through first region 117, and then through second region 116. The photons may be reflected by layer 12 back into the second region 116 and the first region 117. Since lamina 40 may be less than 100 microns thick, photogenerated minority carriers in the first region 117 (the base) do not have far to travel to be collected at the second region 116 (the emitter) when the second region 116 and p-n junction 19 are located generally proximate surface 41 and distant from surface 43 through which the photons enter. In fact, because any carriers generated in a heavily doped region formed at the front of the cell may tend to recombine immediately, moving the p-n junction 19 away from surface 43 and closer to surface 41 where fewer carriers are generated may provide an efficiency advantage. This is further described in Hilali et. al., U.S. patent application Ser. No. 12/189,158, "Photovoltaic Cell Comprising a Thin Lamina Having a Rear Junction and Method of Making," Filed Aug. 10, 2008, which is hereby incorporated by reference herein in its entirety for any and all purposes.

Note that other arrangements of, inter alia, the receiver element 60 and lamina 40 are possible. For example, receiver element 60 may be transparent and serve as a superstrate so that photons pass through the receiver element 60 and through surface 41 into lamina 40 for conversion into electrical energy. In this implementation, layer 12 may be a transparent conductive oxide to allow the photons to pass through the receiver element 60, through layer 12, and into lamina 40. If it is desired to maintain p-n junction 19 at the rear of the cell, the doping step to form second region 116 may be performed after cleaving of lamina 40 by diffusing second conductivity-type dopants through surface 43 rather than through surface 41.

In order to form the photovoltaic assembly 82 generally illustrated in FIG. 3 from assembly 80, a transparent dielectric layer 64 is deposited on surface 43 of lamina 40. If, as in the implementation of FIG. 3, the first region 117 of lamina 40 is lightly doped n-type, then transparent dielectric layer 64 is preferably silicon nitride, formed, for example, by plasma-enhanced chemical vapor deposition. Silicon nitride also serves as an antireflective coating (ARC). Transparent dielectric layer 64 may be between about 500 and 2000 angstroms thick, for example, about 650 angstroms thick.

Next trenches 54 are formed in transparent dielectric layer 64, for example by laser ablation. Trenches 54 may be between about 10 microns and about 50 microns wide. The pitch of trenches 54 is preferably between about 200 microns and about 1500 microns. The pitch and width of the trenches 54 will be adjusted to account for the material used to form contacts 57 within the trenches 54, the expected current from the cell, and so forth, as will be understood by those of ordinary skill in the art upon study of this disclosure.

After formation of the trenches 54, a source of an n-type dopant, for example, a phosphorus dopant such as phosphoric acid or phosphorus pentoxide, is emplaced on the regions of surface 43 of lamina 40 exposed by trenches 54 by, for example, screen printing, aerosol printing, or inkjet printing. Passing a laser beam over the regions of surface 43 with n-type dopant emplaced thereon results in heavily n-doped regions 14, as illustrated. Laser heating of lamina 40 will be very local, typically only tens of nanometers deep, and is achieved without subjecting receiver element 60 or the body of lamina 40 to a high-temperature step that could disrupt the bond between the lamina 40 and the receiver element 60. In various implementations, the heavily n-doped regions 14 will be no more than ten percent of the surface area of surface 43. In some implementations, after formation of the heavily n-doped regions 14, any remaining undiffused dopant is rinsed off with deionized water followed by a quick buffered oxide etch to remove any phosphosilicate glass that may have formed, preferably followed by an additional rinse in deionized water.

After formation of the heavily n-doped regions 14, conductive contacts 57 are formed in trenches 54 by plating or other techniques. For example, a nickel seed layer (not shown) may be emplaced on surface 43 of lamina 40 within trenches 54 followed by, for example, electroplating of copper, or conventional or light-induced plating of either silver or copper. These plating techniques selectively deposit the metal thereby forming conductive contacts 57. The thickness of conductive contacts 57 will be selected to produce the desired resistance, and may be, for example, from about 7 microns to about 10 microns. In this implementation, the layer 12 forms a conductive contact 59 opposite to conductive contacts 57 so that current generated within lamina 40 may be transmitted through conductive contacts 57 and conductive contacts 59.

Surface 63 of receiver element 60 may be affixed to a substrate 90, which generally supports the photovoltaic assembly 82. A plurality of photovoltaic assemblies 82 may be affixed to the substrate 90 and electrically connected to form a photovoltaic module.

Figure 4:
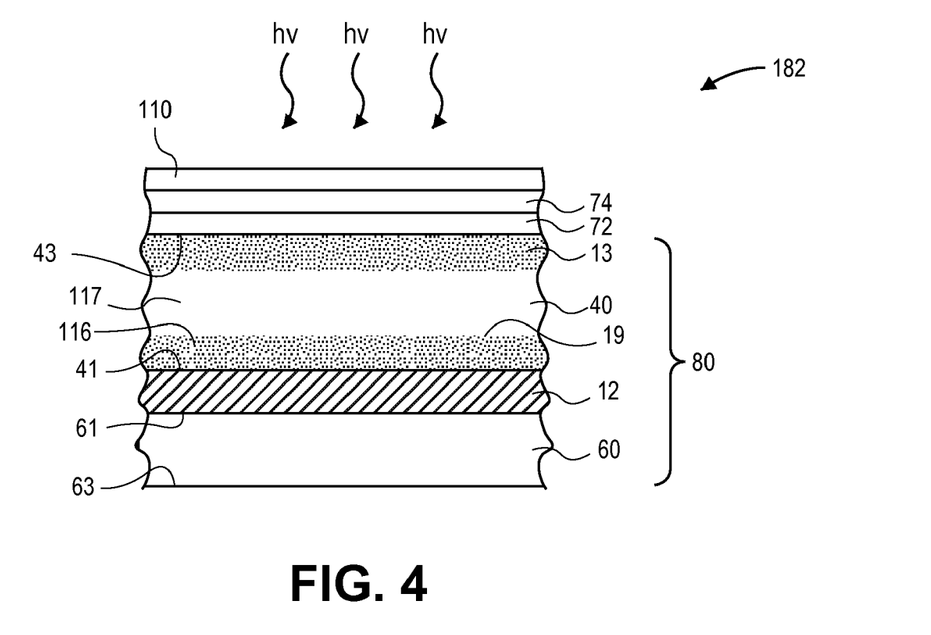
FIG. 4 illustrates by a cross-sectional view another exemplary implementation of a photovoltaic cell with a lamina secured to a receiver element included therein.

Another implementation of photovoltaic assembly 182 formed from assembly 80 is generally illustrated in FIG. 4. The photovoltaic assembly 182, in this implementation, is formed from the assembly 80 in such a way that the assembly 80 is not subjected to high temperatures that could disrupt the bond between the lamina 40 and the receiver element 60. In this implementation, surface 43, which is created by exfoliation of the lamina 40 from donor wafer 20, is passivated by depositing an amorphous silicon layer 72 on surface 43. A heavily doped amorphous silicon layer 74 of the first conductivity type, which is n-type in this implementation, is deposited upon layer 72. Layer 74 can be deposited upon layer 72 at relatively low temperature and functions as a front surface field. A transparent conductive oxide layer 110 is then deposited on layer 74. Appropriate materials for layer 110 include aluminum-doped zinc oxide, as well as indium tin oxide, tin oxide, and titanium oxide. Layer 110 may act as both a top electrode and an antireflective layer. In alternative implementations, one or more additional antireflective layers may be formed on top of layer 110. Conductive contacts (not shown) can be formed on layer 110, and photovoltaic assembly 182 may be affixed to a substrate or superstrate and electrically connected in series with other photovoltaic assemblies 182 to form a photovoltaic module.

The methods disclosed herein may be used to bond a donor wafer 20 to a receiver element 60 with a plurality of layers interposed between the donor wafer 20 and the receiver element 60, for example layers 211, 272, and 274 as illustrated in FIGS. 5A and 5B. In the implementation of the photovoltaic assembly 282 generally illustrated in FIGS. 5A and 5B, one or both heavily doped regions are formed in amorphous semiconductor layers. In the implementation illustrated in FIGS. 5A and 5B, donor wafer 20 is a lightly n-doped silicon wafer (as always, in alternate embodiments, conductivity types can be reversed.) Surface 41 of wafer 20 is optionally roughened. After cleaning surface 41, a layer 272 of intrinsic (undoped) amorphous silicon is deposited on surface 41, followed by a layer 274 of n-doped amorphous silicon by any suitable method, for example by plasma enhanced chemical vapor deposition (PECVD). The combined thickness of amorphous layers 272 and 274 may be between about 200 and about 500 angstroms, for example about 350 angstroms. In one embodiment, intrinsic layer 272 is about 50 angstroms thick, while n-type amorphous layer 274 is about 300 angstroms thick. Gas ions are implanted through layers 274, 272 and into first surface 41 to define cleave plane 30. It will be understood that the implant energy must be adjusted to compensate for the added thickness of amorphous layers 274 and 272. A reflective, conductive metal layer 211 is formed on n-doped layer 274, on receiver element 60, or both. Following the formation of the cleave plane 30 and creation of layer 211, the donor wafer 20 with layers 272, 274 deposited thereupon, layer 211 (which may be on the receiver element 60, on layer 274, or both), and the receiver element 60 may be heated to a bonding temperature, the bonding temperature being less than the exfoliation temperature. The donor wafer 20 and the receiver element 60 may be generally maintained separate from one another while being heated to about the bonding temperature. With the donor wafer 20, the layer 211, layer 272, layer 274, and the receiver element 60 at the bonding temperature, the donor wafer 20 is generally biased against surface 61 of the receiver element 60 with layer 272, layer 274, and layer 211 intervening between the donor wafer 20 and the receiver element 60, and bonded together as illustrated in FIG. 5A. The bond may be formed by, for example, thermo-compression or by anodic bonding, and the bonding temperature may facilitate the bonding of the donor wafer 20 and receiver element 60 to one another. After bonding, the donor wafer 20 may be heated from the bonding temperature to the exfoliation temperature and the lamina 40 exfoliated from the donor wafer 20, which results in lamina 40 bonded to receiver element 60 with layer 272, layer 274, and layer 211 interposed between the lamina 40 and the receiver wafer 60 to form assembly 280, as illustrated in FIG. 5B.

In other implementations following the formation of the cleave plane 30 and creation of layer 211, the donor wafer 20 with layers 272, 274 deposited thereupon, layer 211, and the receiver element 60 are heated to the exfoliation temperature. The donor wafer 20 and the receiver element 60 may be generally maintained separate from one another while being heated to about the exfoliation temperature. With the donor wafer 20, the layer 12, and the receiver element 60 at about the exfoliation temperature, the donor wafer 20 is generally biased against surface 61 of the receiver element with layer 272, layer 274, and layer 211 intervening between the donor wafer 20 and the receiver element 60, and the resulting assemblage bonded together by thermo-compression or by anodic bonding. After bonding, the donor wafer 20 is maintained at the exfoliation temperature until the lamina 40 is exfoliated from the donor wafer 20, which results in lamina 40 bonded to receiver element 60 with layer 272, layer 274, and layer 211 interposed between the lamina 40 and the receiver wafer 60 to form assembly 280.

As illustrated in FIG. 5B, lamina 40 is exfoliated from wafer 20 along cleave plane 30, creating second surface 43. Second surface 43 is optionally roughened, and is cleaned. Intrinsic amorphous silicon layer 276 is deposited on second surface 43 followed by p-doped amorphous silicon layer 278 upon layer 276. The thicknesses of intrinsic amorphous layer 276 and p-doped amorphous layer 278 may be about the same as intrinsic amorphous layer 272 and n-doped amorphous layer 274, respectively, or may be different. Next antireflective layer 264, which may be, for example, silicon nitride, is formed on p-type amorphous layer 278 by any suitable method. In alternative embodiments, antireflective layer 264 may be a transparent conductive oxide (TCO). If layer 264 is a TCO, layer 264 may be, for example, composed of indium tin oxide, tin oxide, titanium oxide, zinc oxide, and suchlike. A TCO will serve as both a top electrode and an antireflective layer and may be between about 500 and 1500 angstroms thick, for example, about 900 angstroms thick. Finally wiring 257 is formed on antireflective layer 264. Wiring 257 can be formed by any appropriate method.

FIG. 5B illustrates the completed photovoltaic assembly 282, which includes lamina 40 and receiver element 60. In this implementation, lamina 40 is the base, or a portion of the base, of the photovoltaic cell. Heavily doped p-type amorphous layer 278 is the emitter, or a portion of the emitter. Amorphous layer 276 is intrinsic, but in practice, amorphous silicon will include defects that cause it to behave as if slightly n-type or slightly p-type. If layer 276 behaves as if slightly p-type, then layer 276 will function as part of the emitter, while if layer 276 behaves as if slightly n-type, layer 276 will function as part of the base.

A plurality of such photovoltaic assemblies 282 may be fabricated, and each will be inspected for defects and tested for performance and sorted. Photovoltaic assemblies 282 may be affixed to substrate 90 and electrically connected in series to form a photovoltaic module. In alternative embodiments, photovoltaic assemblies 282 could be affixed to a transparent superstrate (not shown).

The foregoing detailed description discloses and describes various exemplary implementations. Upon study of the specification, one of ordinary skill in the art may readily recognize from the detailed description and from the accompanying figures and claims that various changes, modifications and variations can be made therein without departing from the spirit and scope of the inventions as defined in the following claims.

The invention claimed is:

1. A method for securing a lamina to a receiver element, comprising the steps of:
   forming a cleave plane within a donor wafer;
   heating the donor wafer to a temperature above room temperature while maintaining the donor wafer separate from a receiver element;
   heating the receiver element to about the temperature while maintaining the receiver element separate from the donor wafer, the receiver element being comprised of a receiver element material;
   bonding the donor wafer to the receiver element with the donor wafer at about the temperature and the receiver element at about the temperature; and
   exfoliating the donor wafer along the cleave plane by maintaining the donor wafer with receiver element bonded thererto at about the temperature thereby transferring a lamina from the donor wafer onto the receiver element.

2. The method, as in claim 1, wherein an exfoliation time corresponds to the temperature, and the temperature is chosen such that the heating step and the bonding step may be completed within the exfoliation time.

3. The method, as in claim 1, further comprising:
   interposing an adhesive layer between the donor wafer and the receiver element; and
   bonding adhesively the donor wafer to the receiver element with the adhesive layer interposed between the donor wafer and the receiver element.

4. The method, as in claim 1, wherein the donor wafer is comprised of a donor wafer material doped to a first conductivity type, and further comprising:
   doping a first surface of the donor wafer to a second conductivity type opposite the first conductivity type wherein the first surface is to be bonded to the receiver element.

5. The method, as in claim 1, wherein the donor wafer consists essentially of monocrystalline silicon.

6. The method, as in claim 1, further comprising the step of:
   completing fabrication of a photovoltaic assembly, wherein the photovoltaic assembly includes the lamina bonded to the receiver element.

7. The method, as in claim 1, wherein the lamina defines a lamina thickness, and the lamina thickness is within the range between about 0.2 microns and about 100 microns.

8. The method, as in claim 1, wherein the lamina defines a lamina thickness, and the lamina thickness is within the range between about 1 micron and about 20 microns.

9. The method, as in claim 1, wherein the step of forming a cleave plane within the donor wafer comprises:
   implanting one or more species of gas ions within the donor wafer.

10. The method, as in claim 1, wherein the step of bonding the donor wafer to the receiver element comprises:
   interposing a conductive layer between the receiver element and the donor wafer.

11. The method, as in claim 10, wherein the conductive layer comprises at least one metal chosen from the group consisting of silver, gold, platinum, titanium, aluminum, chromium, molybdenum, tantalum, zirconium, vanadium, indium, cobalt, antimony, and tungsten.

12. The method, as in claim 10, wherein the conductive layer comprises at least one metal oxide.

13. The method, as in claim 1, wherein the step of bonding the donor wafer to the receiver element comprises:
   interposing a nonconductive layer between the receiver element and the donor wafer.

14. The method, as in claim 1, wherein the step of bonding the donor wafer to the receiver element comprises:
   interposing a plurality of layers between the receiver element and the donor wafer.

15. The method, as in claim 10, further comprising:
   interposing an adhesive layer between the conductive layer and the receiver element; and
   bonding adhesively the donor wafer to the receiver element with the conductive layer and the adhesive layer interposed between the donor wafer and the receiver element such that the adhesive layer is interposed between the conductive layer and the receiver element.

16. The method, as in claim 1, wherein the step of bonding the donor wafer to the receiver element comprises:
   applying a voltage across the donor wafer and the receiver element thereby forming an anodic bond between the donor wafer and the receiver element.

17. The method, as in claim 1, wherein the step of bonding the donor wafer to the receiver element comprises:
   applying thermo-compression to the receiver element and the donor wafer thereby forming a bond between the donor wafer and the receiver element.

18. The method, as in claim 1, wherein the first temperature is between 300° C. and 450° C.

19. A method for securing a semiconductor lamina to a receiver element, comprising the steps of:
   forming a cleave plane within a donor wafer;
   heating the donor wafer to near a bonding temperature while maintaining the donor wafer separate from the receiver element;
   heating the receiver element to near the bonding temperature while maintaining the receiver element separate from the donor wafer;
   bonding the donor wafer to the receiver element with the donor wafer at about the bonding temperature and the receiver element at about the bonding temperature;
   heating the receiver element with donor wafer bonded thereto from the bonding temperature to an exfoliation temperature, the exfoliation temperature being greater than the bonding temperature; and
   exfoliating the donor wafer along the cleave plane thereby transferring a semiconductor lamina onto the receiver element.

20. The method, as in claim 19, wherein the step of bonding the donor wafer to the receiver element comprises:
   interposing a layer between the receiver element and the donor wafer.

21. The method, as in claim 19, wherein the step of bonding the donor wafer to the receiver element comprises:
   applying thermo-compression to the receiver element and the donor wafer thereby forming a bond between the donor wafer and the receiver element.

22. The method, as in claim 19, wherein the step of bonding the donor wafer to the receiver element comprises:
   forming an anodic bond between the donor wafer and the receiver element by applying a voltage across the donor wafer and the receiver element.

23. The method, as in claim 19, wherein the step of forming a cleave plane within a donor wafer comprises:
   implanting hydrogen ions within the donor wafer wherein the donor wafer is comprised of monocrystalline silicon.

24. The method, as in claim 19, wherein the bonding temperature is greater than ambient temperature but not sufficient to induce exfoliation.

* * * * *